(12) United States Patent
Kim et al.

(10) Patent No.: US 7,029,509 B2
(45) Date of Patent: Apr. 18, 2006

(54) CMP SLURRY COMPOSITION AND A METHOD FOR PLANARIZING SEMICONDUCTOR DEVICE USING THE SAME

(75) Inventors: Sang-Yong Kim, Bucheon (KR); Kwang-Ha Suh, Bucheon (KR); Tae-Kyu Kim, Seoul (KR); Hwi-Jin Kim, Seoul (KR)

(73) Assignee: Dongbuanam Semiconductor Inc., (KR)

( * ) Notice: Subject to any disclaimer, the term of this patent is extended or adjusted under 35 U.S.C. 154(b) by 1 day.

(21) Appl. No.: 10/399,062

(22) PCT Filed: Feb. 5, 2001

(86) PCT No.: PCT/KR01/00163

§ 371 (c)(1),
(2), (4) Date: Apr. 11, 2003

(87) PCT Pub. No.: WO02/31072

PCT Pub. Date: Apr. 18, 2002

(65) Prior Publication Data

US 2004/0020134 A1    Feb. 5, 2004

(51) Int. Cl.
*C09G 1/02* (2006.01)
*C09G 1/04* (2006.01)
*H01L 21/302* (2006.01)

(52) U.S. Cl. ............................ 51/308; 106/3; 438/692; 438/693

(58) Field of Classification Search ................ 51/308; 106/3; 252/79.1; 438/692, 693; 216/89, 216/96, 100, 101
See application file for complete search history.

(56) References Cited

U.S. PATENT DOCUMENTS 5,084,071 A * 1/1992 Nenadic et al. .............. 51/309
6,471,735 B1 * 10/2002 Misra et al. .................. 51/308
2001/0037821 A1 * 11/2001 Staley et al. ............... 134/25.4

FOREIGN PATENT DOCUMENTS

| EP | 0401147 B1 * | 12/1995 |
| EP | 0853335 A2 * | 7/1998 |
| WO | WO 98/47976 | * 10/1998 |

* cited by examiner

*Primary Examiner*—Michael Marcheschi
(74) *Attorney, Agent, or Firm*—Fulbright & Jaworski LLP

(57) ABSTRACT

The present invention relates to a CMP (chemical mechanical polishing) slurry composition and a method for planarizing a semiconductor device. The CMP composition comprises fumed silica, tetramethyl ammonium hydroxide, phosphates, fluorine compounds and deionized water. The method of planarizing comprises the steps of etching, subsequently laminating and polishing a semiconductor device by said CMP slurry composition.

19 Claims, 2 Drawing Sheets

Nitride thin film deposition process (B)

Trench etch process (C)

Oxide thin film deposition process (D)

Reverse moat Etch process (E)

STI CMP process

(F)

Nitride thin film strip process

Oxide thin film
deposition process (B)

STI CMP process (C)

Nitride thin film
strip process

CMP SLURRY COMPOSITION AND A METHOD FOR PLANARIZING SEMICONDUCTOR DEVICE USING THE SAME

BACKGROUND OF THE INVENTION (a) Field of the Invention

The present invention relates to a chemical mechanical polishing (CMP) composition and a method for planarizing a semiconductor device using the same. Specifically, the present invention relates to a CMP slurry composition that is used for an interlayer dielectric and in a shallow trench isolation (STI) process during a CMP process conducted for obtaining a semiconductor multi-layer wiring structure, and can largely improve polishing performance, polishing efficiency and selectivity, and simplify the STI CMP process, and a method for planarizing a semiconductor device using the CMP slurry composition.

(b) Description of the Related Art

Tendencies for semiconductors to have high performance and a high integration degree have made the designs of microcircuit devices finer yearly, and thus multi-layer wiring structures are essentially required for designing and manufacturing VLSI and ULSI semiconductor devices. Since the depth of focus a photolithography process becomes shallow and a process margin decreases as the whole wiring width becomes finer and multi-layered, the necessity for planarizing the pattern-forming surface to remove height differences has arisen.

So far, spin-on-glass, resist etch back, etc. have been suggested and used for such planarizing methods. However, planarity sufficient for manufacturing advanced VLSI and ULSI semiconductor devices could not be obtained by said methods. Accordingly, chemical mechanical polishing methods have been suggested, continuously studied and developed, and recently the range of the applications thereof has become very wide. Examples of the applications include polishing of silicon dioxide ($SiO_2$) used for an interlayer dielectric and in an STI process, polishing of a metal wiring layer and interlayer via metal, consisting of tungsten, aluminum (or aluminum alloy), copper, etc., polishing of polysilicon layer used for a deep trench capacitor or a multi-layer gate oxide that were suggested because of the tendency of DRAM to have high capacity and high integration degree, etc. In addition to these commercially applicable CMP processes, a variety of CMP processes will be able to be applied from now on. The examples include a CMP process for low k (interlayer dielectric) material recently highlighted with a Cu Dual Damascene process. Such low k material includes inorganic HSQ (hydrogen silsequioxane), macromolecule BCB (bisbenzocyclobutene), fluorine-containing organic film and various porous membranes, etc.

Recently, one of the device separation methods, Shallow Trench Isolation (STI) has attracted a great deal of attention as a technology essential for densification of semiconductor devices. This method comprises preparing a shallow trench on a silicon wafer, depositing $SiO_2$ thereon and planarizing it with CMP, and it enables device separation in a smaller area than a conventional local oxidation of silicon (LOCOS) method that causes a bird's beak structure, and it has excellent performances.

Figure 1:
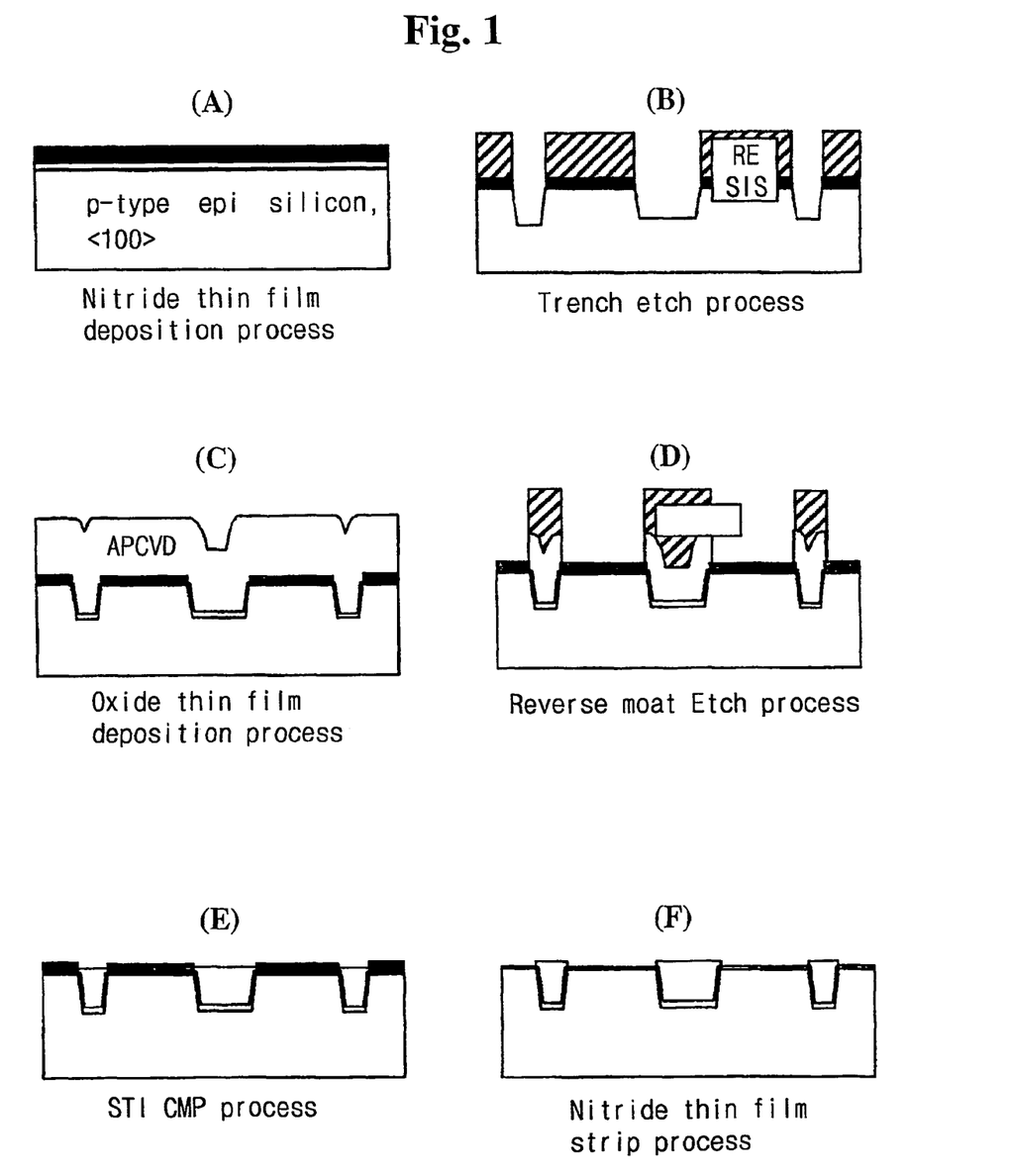
FIG. 1(A) shows a nitride thin film deposition process of a schematic process of planarizing a semiconductor device comprising a conventional STI CMP process.
FIG. 1(B) shows a trench etch process of a schematic process of planarizing a semiconductor device comprising a conventional STI CMP process.
FIG. 1(C) shows an oxide thin film deposition process of a schematic process of planarizing a semiconductor device comprising a conventional STI CMP process.
FIG. 1(D) shows a reverse moat etch process of a schematic process of planarizing a semiconductor device comprising a conventional STI CMP process.
FIG. 1(E) shows a STI CMP process of a schematic process of planarizing a semiconductor device comprising a conventional STI CMP process.
FIG. 1(F) shows a nitride thin film strip process of a schematic process of planarizing a semiconductor device comprising a conventional STI CMP process.

However, conventional polishing slurry could not obtain a sufficient polishing selectivity rate of $SiO_2$ and $Si_3N_4$, and thus there was no choice but to use a complicated Reverse Moat Process. FIG. 1 schematically shows a process chart of a method for planarizing semiconductor devices using a conventional Reverse Moat Process. This method comprises the steps of a) forming a silicon nitride film on a semiconductor substrate, b) forming a trench on the semiconductor substrate, c) forming an oxide film on top of the trench and the semiconductor substrate, d) reverse moat etching the semiconductor substrate on which the oxide film forms, e) polishing the reverse moat etched semiconductor substrate using a CMP slurry composition, and f) stripping the nitride thin film of the polished semiconductor substrate. Step d) is conducted in order to prevent problems in step f) due to $SiO_2$ residues on $Si_3N_4$ layer. However, said method is too complicated, and thus process margin security and productivity decrease.

SUMMARY OF THE INVENTION

Accordingly, the present invention is made to solve these problems of the prior art, and it is an object of the present invention to provide a CMP slurry composition that can largely improve polishing performance and efficiency in polishing semiconductor devices.

It is another object of the present invention to provide a CMP slurry composition that can remarkably simplify a CMP process in manufacturing semiconductor devices.

It is another object of the present invention to provide a simplified method for planarizing semiconductor devices using the improved CMP slurry composition.

In order to achieve these objects, the present invention provides a CMP (chemical mechanical polishing) slurry composition comprising a) fumed silica;
b) TMAH (tetramethyl ammonium hydroxide);
c) phosphate ionic additives;
d) a fluorine compound; and
e) deionized water In addition, the present invention provides a method for planarizing a semiconductor device characterized by using the CMP slurry composition, when etching an oxide film and a nitride film of a semiconductor device on which a nitride film and an oxide film are subsequently laminated, to chemically and mechanically polish the semiconductor device.

DETAILED DESCRIPTION AND THE PREFERRED EMBODIMENTS

The present invention will now be explained in more detail.

The CMP slurry composition of the present invention comprises (a) fumed silica, (b) TMAH (tetramethyl ammonium hydroxide), (c) phosphate anionic additives, (d) a fluorine compound and (e) deionized water.

Fumed silica is produced by the phase hydrolysis of silicon tetrachloride in a hydrogen oxygen flame, and generally has very high purity. In addition, since fumed silica can have a variety of primary particle sizes, uniformities, agglomeration degrees, strengths, viscosities and purities depending on the manufacturing conditions, properties appropriate for their purposes can be selected. Preferably, the fumed silica in the CMP slurry composition of the present invention has a primary particle diameter of 10 to 50 nm, more preferably 15 to 40 nm, and most preferably 20 to 35 nm. And, in order to secure an improvement in polishing efficiency and a reproduction of polishing performance, the primary particle is uniform and thus has a low multi-dispersion degree, a low poly-dispersity viscosity and small metal impurity contents. Preferably, the viscosity of 4 wt % dispersion in water is 4 cPs or less, and the contents of metal impurities is 70 ppm or less.

The contents of the fumed silica in the CMP slurry composition of the present invention is preferably 1 to 40 wt %, more preferably 3 to 30 wt %, and most preferably 5 to 25 wt %. If the concentration of the fumed silica is too high, the viscosity of the slurry will increase, preservation stability will decrease, and scratches will form on a polished surface during a polishing process. And, if the concentration is too low, a polishing efficiency will be insufficient.

The TMAH (tetramethyl ammonium hydroxide) controls the pH of a solution and increases an absolute value of zeta potential of polishing particles to increase an electrical repulsive force between particles, thereby improving dispersion stability of particles and decreasing the viscosity of particle dispersion to facilitate the production of a slurry. In addition, it creates a slurry-environment for imparting etching effect so as to function as a polishing accelerator for improving polishing rate and efficiency. Generally, as a pH controlling agent, inorganic or organic alkalis such as KOH, $NH_4OH$, etc., were used, in case a surface to be polished is an interlayer dielectric or $SiO_2$ layer used in an STI process. However, in case such pH controlling agent is alkali metal ions such as $Li^+$, $Na^+$, $K^+$, etc., it has a high mobility and thus easily diffuses into an insulating film to increase a leakage current thereby decreasing reliability of semiconductor devices. In addition, in the case of ammonium hydroxide, it has strong volatility and thus causes many problems in the polishing process due to the change of pH of slurry, the changes of ammonium concentration and solid content, decrease in stability and increase in number of large particles, etc., and it has many problems such as odors due to evaporated ammonia and effects thereof on subsequent processes. The CMP slurry composition of the present invention solved these problems by using TMAH as a pH controlling agent.

In addition, the CMP slurry composition of the present invention may further comprise amine group compounds having a low volatility and low metal impurity contents. The amine compounds include groups containing one or more alkyl, alkyl derivative or nitrogen, containing group and preferably, they are less volatile than ammonia, the chain length thereof is not too long so as to maintain a solubility in water, and contain functional groups for increasing solubility. And, they may comprise aromatic groups as far as the solubility thereof is maintained. The Examples, although not limited, include primary amines, secondary amines, tertiary amines, quartenary amines, quaternary ammonium salts, heterocyclic amines, etc., such as ethanol amine, isopropyl amine, dipropyl amine, ethylene diamine (EDA), propane diamine, hexamethylenediamine, hydrazine compound, tetramethyl ammonium fluoride (TMAF), tetramethyl ammonium chloride (TMA-CI), tetraethyl ammonium hydroxide (TEAH), tetraethyl ammonium fluoride(TEAF), tetraethyl ammonium chloride(TEA-CI), dimethyl diethyl ammonium hydroxide, dimethyl diethyl ammonium fluoride, dimethyl diethyl ammonium chloride, alkylbenzyldimethylammonium hydroxide, diethylenetriamine, triethylenetetramine (TETA), tetraethylenepentamine, aminoethylethanolamine (AEEA), piperazine, etc. TMAH is preferably used. The pH controlling agent comprising TMAH is preferably contained in the CMP composition of the present invention in an amount of 0.01 to 5 wt %, more preferably 0.05 to 3 wt %, and most preferably 0.1 to 1 wt %. The pH of the resultant CMP slurry composition is preferably 9 to 12.

The phosphate series anionic additives and fluorine compounds have a function for increasing polishing selectivity ratio of polishing rate for $SiO_2$ and $Si_3N_4$ in STI process. As the polishing rate of $SiO_2$ increases and he polishing rate of $Si_3N_4$ decreases, the polishing selectivity rate increases. When the polishing rate of $SiO_2$ is constant, the polishing selectivity increases as the polishing rate of $Si_3N_4$ decreases, and when the polishing rate of $Si_3N_4$ is constant, it increases as the polishing rate of $SiO_2$ increases. In a practical process, it is preferable to make the polishing rate of $Si_3N_4$ near 0 to increase the polishing selectivity rate, even if the polishing rate of $SiO_2$ is rather low. The CMP slurry composition of the present invention selectively forms a protective film on $Si_3N_4$ and selectively etches $SiO_2$ to increase the polishing rate of $SiO_2$ simultaneously with minimizing the polishing rate of $Si_3N_4$ to maximize selectivity. The phosphate anionic additives form a selective protective film on a $Si_3N_4$ layer. The phosphate anionic additives comprise a polar component that reacts with $Si_3N_4$ to form a protective film and an apolar component that remains without reacting with $Si_3N_4$ to prevent reactions with polishing particles or chemical components of slurry. Preferably, the polar component is mono- or di-phosphate, since unreacted polar component may functions as a reaction site for reacting with polishing particles and chemical components of a slurry. Although the apolar group, linear, branched, aliphatic or aromatic group of hydrocarbon or fluorocarbon can be used without limitation, it preferably has small number of polar components acting as a reaction site and has short chain length and size in order to maintain solubility since it is preferable to have a solubility in water and a steric hindrance against chemical mechanical actions of slurry. As the phosphate anionic additives, a variety of phosphate esters or polyphosphate esters such as alkyl phosphates, polyethoxylated alcohol phosphates, polyethoxylated phenol phosphates, polyoxyethylene alkyl ether phosphates, etc. can be used. The phosphate anionic additives have good solubility in water solvent and little foam formation, are stable in alkali solution, and do not cause color change of solution. Preferably, compounds except alkali metal salt of the above-mentioned phosphate anionic additives are used, because the alkali metal salt causes contamination by impurities. The contents of the phosphate anionic additives are preferably 0.0001 to 3 wt %, more preferably 0.0005 to 2 wt %, and still more preferably 0.001 to 1 wt %.

In addition, the CMP slurry composition of the present invention comprises a fluorine compound. The fluorine compound acts as a selective etching agent for $SiO_2$ layer. The fluorine compound preferably exists as an amine salt, and it is more preferable to add TMAF (tetramethyl ammonium fluoride) or a small amount of HF to the composition than to use TMAF salt that is an intermediate of reaction of HF with TMAH, the above-mentioned pH controlling agent. The contents of the fluorine compound are preferably 0.0001 to 1 wt %, more preferably 0.0005 to 0.8 wt %, and still more preferably 0.001 to 0.5 wt %.

In addition, the CMP slurry composition of the present invention comprises deionized water, which acts as a solvent.

In addition, the CMP slurry composition may further comprise a dispersant for maximally inhibiting gelling and particle precipitation due to storage temperature charge, aging, etc., and maintaining dispersion stability, a buffer solution for inhibiting the effects of pH change on dispersion stability of particles, and various salts for decreasing viscosity of particle dispersion. As the dispersant which imparts a steric hindrance to the dispersed particles to inhibit collisions and agglomerations between particles, anionic, cationic, nonionic, amphoteric dispersant or a combination thereof, etc. can be used according to the use and effects thereof. In addition, as the salts, metal ions such as $Na^+$, $K^+$, etc., ammonium and ammonia derivative ions, and various inorganic or organic salts such as fluoride, chloride, bromide, iodide, acetate, carbonate, phosphate, sulfate, etc. can be used. Preferably, TMAF (tetra methyl ammonium fluoride) is used since it has low metal impurity contents and low volatility.

The particle size, uniformity and dispersion stability of polished particles as well as the chemical composition of slurry composition largely affects on abrasive properties and efficiency. In order to prepare a slurry, abrasive particle powders should be initially dispersed in water solvent, the efficiency of which determines the stability of a pre-mixing solution, facility of subsequent process, poly dispersity of secondary particle distribution, and distribution degree of the number of macro particles. The CMP slurry composition of the present invention is prepared by adding alkali compounds for making desired pH of slurry to water solvent to mix them, gradually introducing polishing particles, fumed silica, to disperse it, and adding phosphate anionic additives and fluorine compounds to mix them. The CMP slurry composition of the present invention is preferably dispersed using a high shear mixer. The CMP slurry composition prepared according to said method preferably has 220 to 290 nm of average secondary particle diameter of pre-mixing, more preferably 220 to 280 nm, and still more preferably 220 to 270 nm, and poly dispersity of 0.25 or less, more preferably 0.20 or less, and still more preferably 0.17 or less. The average secondary particle diameter is based on an intensity average, and the poly dispersity amounts to the devitation from 25% to 75% of overall particle size distribution. The values are obtained by using zeta plus manufactured by Brook Haven Corporation.

The most important process for controlling particle size, uniformity and dispersion stability of a slurry composition is a milling process. By a milling process, secondary particles that are comparatively weakly agglomerated cracked into desired particle diameter and simultaneously polishing particles are uniformly dispersed in a solution. Representative milling process includes a bead milling, a ultrasonic milling, a jet milling, etc. In the bead milling method, a composition is significantly contaminated by the bead used and materials from the container, and milling efficiency including particle size distribution, poly dispersity, etc. and productivity decrease. According to the ultrasonic milling process, desired super-minute particles cannot be obtained, and milled secondary particles strongly tend to agglomerate again, thus decreasing stability. And, a supersonic wave treatment apparatus has a high risk of generating metal impurities. According to the conventional milling process, secondary particles of various sizes exist in dispersion because poly dispersity cannot sufficiently decrease, and thus polishing efficiencies such as planarity, etc. are poor and it is difficult to secure the reproduction of polishing performance. The CMP slurry composition of the present invention undergoes a milling process using a jet milling equipment in an opposite collision manner. The jet milling has an advantage of having little source of contamination, capable of giving a uniform impact to decrease poly dispersity, and having good productivity. Representative jet milling apparatus includes nanomizer, microfluidizer, ultimizer, etc. The CMP slurry composition of the present invention preferably uses oppositely colliding initial particle dispersed solution under a pressure of 500 to 3000 $kgf/cm^2$, more preferably 700 to 3000 $kgf/cm^2$, still more preferably 1000 to 3000 $kgf/cm^2$ using the jet milling apparatus. The polishing particles of the resultant CMP slurry composition have an average secondary particle diameter of 150 to 300 nm, preferably 150 to 250 nm, and more preferably 150 to 200 nm. The poly dispersity is better as smaller in order to secure an improvement in polishing efficiency and the reproduction of polishing performance, and the CMP slurry composition of the present invention has preferably the poly dispersity of 0.20 or less, preferably 0.17 or less, and more preferably 0.15 or less.

In addition, the present invention provides a method for planarizing semiconductor devices characterized by using the CMP slurry composition when etching an oxide film and a nitride film of a semiconductor device on which a nitride film and an oxide film are subsequently laminated to polish the semiconductor device chemically and mechanically.

At present, most semiconductor manufacturers conduct Reverse Moat Etching step (d) for removing $SiO_2$ layer on $Si_3N_4$ layer of active area before STI CMP step (e), for stability of STI CMP process, as shown in FIG. 1. In case a part of $SiO_2$ layer remains on nitride ($Si_3N_4$) layer in an active area after STI CMP process, nitride residue forms after a nitride strip process.

Figure 2:
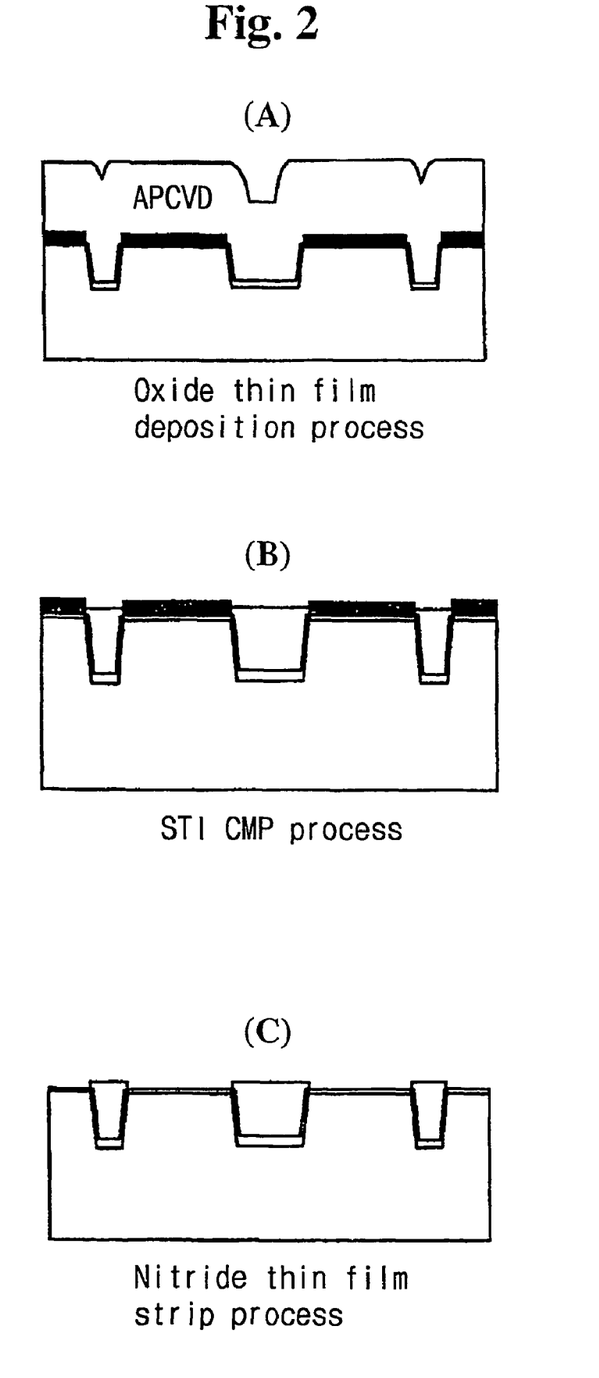
FIG. 2(A) shows an oxide thin film deposition process of a schematic process of planarizing a semiconductor device comprising a conventional STI CMP process.
FIG. 2(B) shows a STI CMP process of a schematic process of planarizing a semiconductor device comprising a conventional STI CMP process.
FIG. 2(C) shows a nitride thin film strip process of a schematic process of planarizing a semiconductor device comprising a conventional STI CMP process.

The planarizing method of the present invention can significantly decrease problems due to the nitride residue since it can sufficiently increase polishing selectivity of $SiO_2$ layer and nitride ($Si_3N_4$) layer, thus not removing most $Si_3N_4$ and enabling overpolishing for $SiO_2$. And, the process can be significantly simplified since STI CMP step can be directly conducted without conducting Reverse Moat Etching step before STI CMP step. FIG. 2 shows the schematic process chart of the simplified method of the present invention for planarizing a semiconductor device using the CMP slurry composition of the present invention. As shown in FIG. 2, the planarizing method of the present invention has the same step of nitride film deposition step, trench etching step, oxide thin film deposition step as the conventional planarizing method, but it omits reverse moat etch process and directly conducts STI CMP process.

The present invention will now be explained with reference to the following Examples. However, these Examples are to illustrate the present invention, and the present invention is not limited thereto.

EXAMPLE 1

1 wt % of TMAH was introduced in water solvent comprising Dieionized water, 12 wt % of fumed silica having an average primary particle diameter of 30 nm and metal impurity contents less than 50 ppm was gradually introduced therein, and 0.1 wt % of $(NH_3)_2HPO_4$ and 0.1 wt % of TMAF were added thereto to prepare a pre-mixing solution. The solution was oppositely collided under pressure of 1000 to 2000 kgf/cm$^2$ with jet milling to prepare a CMP slurry composition. The prepared CMP slurry composition has an average secondary particle diameter of fumed silica of 185 nm and a poly dispersity degree of 0.15.

EXAMPLES 2 TO 12

CMP slurry compositions with compositions of the following Table 1 were prepared by the same method as in Example 1, except that in Example 10, TMAH and TEAH were mixed at a weight ratio of 1:1 so that total mixture amounted to 3 wt % of CMP slurry composition, in Example 11, IPA was used in the same manner as in Example 10 so that it amounted to 1 wt % of the composition, and in Example 12, TMA-CI was used in the same manner as in Example 10 so that it amounted to 1 wt % of the composition.

COMPARATIVE EXAMPLES 1 TO 5

CMP slurry compositions were prepared with compositions of the following Table 1 by the same method as in Example 1.

COMPARATIVE EXAMPLE 6

1 wt % of TMAH was introduced in water solvent comprising Dieionized water, 12 wt % of fumed silica having an average primary particle diameter of 30 nm and metal impurity contents less than 50 ppm was gradually introduced therein, and 0.1 wt % of $(NH_3)_2HPO_4$ and 0.1 wt % of TMAF were added thereto to prepare a pre-mixing solution. The solution was bead milled to prepare a CMP slurry composition. The average secondary particle diameter of the fumed silica was 185 nm and the poly dispersity thereof was 2.50.

TABLE 1

| | Silica (wt %) | TMAH (wt %) | Phosphate Anionic Additive $(NH_3)_2HPO_4$ (wt %) | Fluorine Compound (TMAF) (wt %) | Dieionized water (wt %) | Others (wt %) | Metal impurity contents of silica (wt %) |
|---|---|---|---|---|---|---|---|
| Example 1 | 12% | 1% | 0.1% | 0.1% | The balance To 100 wt % | | 50 ppm |
| Example 2 | 3% | 1% | 0.1% | 0.1% | | | 60 ppm |
| Example 3 | 30% | 1% | 0.1% | 0.1% | | | 70 ppm |
| Example 4 | 12% | 0.01% | 0.1% | 0.1% | | | 50 ppm |
| Example 5 | 20% | 5% | 0.1% | 0.1% | | | 50 ppm |
| Example 6 | 12% | 1% | 0.01% | 0.1% | | | 50 ppm |
| Example 7 | 12% | 1% | 3% | 0.1% | | | 50 ppm |
| Example 8 | 12% | 1% | 0.1% | 1% | | | 50 ppm |
| Example 9 | 15% | 1% | 0.1% | 1% | | | 50 ppm |
| Example 10 | 12% | TEAH 3% | 0.1% | 0.1% | | Dispersant 0.1% | 50 ppm |
| Example 11 | 12% | IPA 1% | 1.5% | 0.1% | | Buffer Solution 0.1% | 50 ppm |
| Example 12 | 12% | TMA-Cl 1% | 0.1% | 0.5% | | Salts 0.1% | 50 ppm |
| Comparative Example 1 | 35% | 1% | 0.1% | 0.1% | | | 50 ppm |
| Comparative Example 2 | 12% | 10% | 0.1% | 0.1% | | | 50 ppm |

TABLE 1-continued

|  | Silica (wt %) | TMAH (wt %) | Phosphate Anionic Additive (NH₃)₂HPO₄ (wt %) | Fluorine Compound (TMAF) (wt %) | Dieionized water (wt %) | Others (wt %) | Metal impurity contents of silica (wt %) |
|---|---|---|---|---|---|---|---|
| Comparative Example 3 | 12% | 1% | 5% | 0.1% |  |  | 50 ppm |
| Comparative Example 4 | 12% | 1% | 0.1% | 3% |  |  | 50 ppm |
| Comparative Example 5 | 10% | 1% | 0.1% | 0.1% |  |  | 100 ppm |
| Comparative Example 6 | 12% | 1% | 0.1% | 0.1% |  |  | 50 ppm |

[Experiment 1]
Effects by the Properties of Fumed Silica

A fumed silica can be controlled in the size and primary particle size, viscosity and agglomeration degree between particles according to conditions of silica preparation process. Such properties affects on facility and efficiency of slurry preparation, preservation stability, polishing performance of prepared slurry, etc. The following Table 2 presents these effects by the properties of fumed silica.

TABLE 2

|  | viscosity | Preservation stability (months) | | Facility of Preparation | |
|---|---|---|---|---|---|
|  |  | Pre-mixing solution | Final product | Process (hours) | Surface Roughness |
| Silica A | 3.0 | 0.25 | 6 | 8 | 0.370 nm |
| Silica B | 2.5 | 0.35 | 12 | 5 | 0.328 nm |

The silica in the Table 2 have a specific surface area (BET) of 80–90 m²/g, metal impurities of 100 ppm or less, and pH of 4% silica primary dispersion of 4.5 to 4.9, all of which are consistent within error.

The preservation stability was measured for 12% silica premixing solution and final slurry prepared therefrom, and it is represented by period (months) to the point where changes in appearances such as layer separation, precipitation, gelling, etc. and the changes of properties such as average particle diameter, viscosity, etc. became rapid. The facility of preparation process is represented by hours required for preparing final slurry (silica 12%) with an average particle diameter of 185 nm. The average particle diameter is based on an intensity average and obtained from Zeta Plus of Brook Haven corporation.

PETEOS (plasma enhanced tetraethoxysilnae) film was deposited with a thickness of approximately 18,000 Å on a wafer plate and then it was polished with Avanti 472 equipment from Speedfam-IPEC company for 3 minutes to measure the surface roughness using AFM (atomic force measurement) from DI company.

Pad used in polishing was IC1000 from Rodel company, and other polishing parameters are presented in the following Table 3.

TABLE 3

| Primary platen RPM | Carrier head RPM | Down Force | Back Pressure |
|---|---|---|---|
| 46 RPM | 28 RPM | 7 PSI | 2 PSI |

As can be seen from Table 2, the lower the viscosity of used silica, the better a preservation stability, the facility of preparation process and a surface roughness.

[Experiment 2]
Effects by the Preparation Method of Slurry Composition

The poly dispersity of secondary particles, the distribution of large particles, metal impurity contents, etc. of a slurry can be controlled by selecting a preparation process thereof. These properties of a slurry affects on polishing efficiencies including the uniformity of polished surface, the degree of scratch formation, etc. during polishing process and the reliability of manufactured semiconductor device. The following Table 4 presents the properties of slurries prepared according to different processes.

TABLE 4

|  | Facility of preparation process (hr) | Preservation stability (months) | Poly dispersity | Surface Roughness (nm) | The number of large particles | The number of scratches |
|---|---|---|---|---|---|---|
| Method A | 6 | 12 | 0.15 | 0.328 | 10000 | 15 or less |
| Method B | 7 | 10 | 0.17 | 0.343 | 13000 | 30 or less |
| Method C | 13 | 6 | 2.50 | 0.414 | 35000 | 100 or less |
| Method D | 9 | 0.25 | 2.50 | 0.389 | 20000 | 80 or less |

Silica B of Experiment B was used for all the methods of Table 4, and other specific conditions are as follows.

Premixing A: A dispersion was prepared by the same method as in Example 6, except that polishing particle powders were gradually introduced and dispersed.

Premixing B: A dispersion was prepared by the same method as in Example 6, except that polishing particle powders were simultaneously introduced and dispersed.

Method A: A slurry was prepared from premixing A by a jet milling process.

Method B: A slurry was prepared from premixing B by a jet milling process.

Method C: A slurry was prepared from premixing A by a bead milling process.

Method D: A slurry was prepared from premixing A by a ultrasonic milling process.

An ultimizer from Sugino Machine company was used as a jet mill, a dyno-mill from SHINMARU ENTERPRISE Company was used as a bead mill, and a Bransonic from Branson Ultrasonics Corporation was used as an ultrasonic mill.

In addition, the facility of preparation process is represented by hours required for preparing a final slurry (silica 12 wt %) with an average particle diameter of 185 nm, and a preservation stability is represented by period (months) to the point when the changes in appearance such as layer separation, precipitation, gelling, etc. and the changes of the properties such as average particle diameter, viscosity, etc. becomes rapid in a final slurry. The poly dispersity amount to the deviation from 25% to 75% of overall particle size distribution, and was obtained by using zeta plus of Brook Haven Corporation. The number of large particles means the number of particles with a size of 1 um or more per unit volume, and is measured using Accusizer 780 of Nicomp Company.

In addition, the number of scratches was measured using AIT equipment from Tencor Company, after depositing PETEOS film with a thickness of approximately 24,000 Å as an interlayer dielectric on a wafer on which pattern is formed by a specific process, and polishing the film with Avanti 472 equipment from Speedfam-IPEC Company using the polishing parameters as presented in Table 1 such that the final thickness of the film became approximately 10,000 Å.

As can be seen from the Table 4, in case the polishing particle powders were gradually introduced and jet milling process was used, the results were better.

[Experiment 3]

The Contents of Impurities According to Preparation Processes

Metal impurity contents of a slurry can be controlled by selecting the raw materials and the preparation process thereof. These properties of a slurry affects on the reliability of prepared semiconductor device. Table 5 presents the properties of slurries prepared using different raw materials by different preparation processes.

TABLE 5

| | Total Metal Impurities (ppm) | Metal impurity on wafer (Conc.*E10atom/cm$^2$) | | | | | |
|---|---|---|---|---|---|---|---|
| | | K | Ca | Fe | Mn | Cu | Zn |
| Slurry A | 100 | 0 | 0 | 0.22 | 0 | 0 | 0 |
| Slurry B | 10000 | 0 | 0 | 0.322 | 0.048 | 0.002 | 0 |

TABLE 5-continued

| | Total Metal Impurities (ppm) | Metal impurity on wafer (Conc.*E10atom/cm$^2$) | | | | | |
|---|---|---|---|---|---|---|---|
| | | K | Ca | Fe | Mn | Cu | Zn |
| Slurry C | 1000 | 0.13 | 0.202 | 0.464 | 0.02 | 0 | 0 |
| Slurry D | 300 | 0 | 0 | 0.386 | 0.002 | 0 | 0 |

Silica B of Example B was used to prepare all the slurries of Table 5, and other specific conditions are as follows:

Raw Material A: the Same as in Example 6

Raw material B: comprising 12 wt % of fumed silica, DI water and 0.1 to 1 wt % of KOH containing 1% or more of alkali metal ions such as Li$^+$ and Na$^+$.

Slurry A: prepared from raw material A by a jet milling process

Slurry B: prepared from raw material B by a jet milling process

Slurry C: prepared from raw material A by a bead milling process

Slurry D: prepared from raw material A by an ultrasonic milling process

Metal impurities on wafer were measured using TREX610T from Technos Company, after depositing PETEOS (plasma enhanced tetraethoxysilane) film with a thickness of approximately 18,000 Å on a wafer plate, and polishing the film with Avanti 472 equipment from Speedgam-IPEC Company using polishing parameters as presented in Table 1 for 3 minutes.

As can be seen from Table 5, the CMP slurry composition of the present invention has remarkably less metal impurity contents than the conventional slurry composition using alkali metal ions and KOH.

[Experiment 4]

The chemical compositions of a slurry largely affect on polishing performances such as selectivity, uniformity of polished surface, etc. Table 6 presented these effects by slurry compositions.

TABLE 6

| | SiO$_2$ R/R | SiO$_2$ R/R NU | Si$_3$N$_4$R/R | Si$_3$N$_4$ R/R NU | R/R selectivity |
|---|---|---|---|---|---|
| Slurry A | 2230 Å/min | 6.87% | 745 Å/min | 5.38% | 2.99:1 |
| Slurry B | 2197 Å/min | 10.56% | 435 Å/min | 7.35% | 5.05:1 |
| Slurry C | 2453 Å/min | 7.06% | 576 Å/min | 13.24% | 4.25:1 |
| Slurry D | 2347 Å/min | 4.09% | 235 Å/min | 6.25% | 9.98:1 |

Silica B was used to prepare all the slurries of the Table 6, and other specific conditions are as follows:

Slurry A: comprising 12 wt % of fumed silica, DI water and 0.1 to 1 wt % of TMAH such that the final slurry has the pH of 9 to 12.

Slurry B: comprising the Slurry A and 0.001 to 1 wt % of ammonium phosphate (NH$_3$)$_2$HPO$_4$ Slurry C: comprising the Slurry A and 0.001 to 0.5 wt % of TMAF (tetra methyl ammonium fluoride)

Slurry D: the same as in Example 6, comprising the Slurry A, 0.001 to 1 wt % of phosphate anionic additives of the Slurry B and 0.001 to 0.5 wt % of fluoride compounds of the Slurry C The polishing selectivity was calculated after depositing PETEOS film with a thickness of approximately 18,000 Å on a wafer plate and deposition a nitride thin film with a thickness of approximately 3,000 Å on another wafer and polishing each wafer for 2 minutes using Avant 472 equipment from Speed fam-IPEC Company using the polishing parameters as in Table 1.

As can be seen from the Table 6, in case using the CMP slurry composition of the present invention, a R/R selectivity rate was 9.98:1, which was remarkably higher than by the other slurry compositions. [Experiment 5]

As can be seen from the Experiment 4, since polishing of $Si_3N_4$ can be minimized and polishing selectivity of $SiO_2$ and $Si_3N_4$ can be significantly improved by adequately controlling the chemical compositions of slurry, a moat process could be directly conducted without undergoing complicated reverse moat process and the process could be significantly simplified. And, since most $Si_3N_4$ are not removed, which enables over polishing for $SiO_2$, problems due to nitride residue in an active area can be significantly reduced. Table 7 presented such effects by chemical compositions of slurries.

TABLE 7

| | The possibility of Moat process | Process simplification effect | The degree of Nitride residue |
|---|---|---|---|
| Slurry A | X | Reverse moat etch process is indispensable | 50–80 Die |
| Slurry B | Δ | Reverse moat etch process is needed | 20–35 Die |
| Slurry C | Δ | Reverse moat etch process is needed | 20–50 Die |
| Slurry D | ○ | Reverse moat etch process can be omitted | 0–5 Die |

The polishing process conditions and the slurries used in the Table 7 were the same as in Experiment 4. And, the degree of nitride residue was represented by the number of attacked dies, when a wafer comprising 1200 dies was polished and nitride residue defects were measured using KLA2350 equipment from Tencor Company.

As can be seen from the Table 7, in case planarizing semiconductor devices using the CMP slurry composition of the present invention, since problems due to residual nitride are significantly reduced, reverse moat etch process can be omitted, which remarkably simplifies planarizing process of semiconductor devices.

As explained, the CMP slurry composition of the present invention does not show any precipitation and layer separation after storage for a few months, and is prevented from agglomeration due to the change in external conditions and aging, thereby preventing defects of interlayer dielectric and remarkably decreasing damage in an active area during STI process.

In addition, since the source of contamination is minimized during preparation process by using raw materials of high purity containing small metal impurities and improving a milling process, the contents of impurities in a slurry remarkably decrease.

In addition, when chemically and mechanically polishing an oxide film and a nitride film of a semiconductor device on which a nitride film and an oxide film are subsequently laminated, since the polishing of $Si_3N_4$ is minimized and the polishing selectivity rate of $SiO_2$ and $Si_3N_4$ is significantly improved, a moat process can be directly conducted without undergoing complicated reverse moat process, and since most $Si_3N_4$ are not removed, which enables overpolishing for $SiO_2$, problems due to nitride residue in an active area can be remarkably reduced.

What is claimed is:

1. A CMP (chemical mechanical polishing) composition comprising;
   (a) fumed silica;
   (b) TMAH (tetra methyl ammonium hydroxide);
   (c) phosphate anionic additives selected from the group consisting of phosphate esters, polyphosphate esters, and phosphate anionic additives containing a fluorocarbon group;
   (d) fluorine compounds; and
   (e) deionized water.

2. The CMP composition according to claim 1, wherein the fumed silica has a primary particle diameter of 10 to 50 nm.

3. The CMP composition according to claim 1, wherein the content of the fumed silica is 3 to 30 wt %.

4. The CMP composition according to claim 1, wherein the fumed silica contains less than 70 ppm of metal impurities.

5. The CMP composition according to claim 1, wherein the content of the TMAH is 0.01 to 5 wt %.

6. The CMP composition according to claim 1, further comprising primary amines, secondary amines, tertiary amines, quaternary amines, quaternary ammonium salts or heterocyclic amines selected from the group consisting of ethanol amine, isopropyl amine, dipropyl amine, ethylene diamine(EDA), propane diamine, hexamethylenediamine, hydrazine compound, tetramethyl ammonium fluoride (TMAF), TMAH, tetra methyl ammonium chloride(TMA-Cl), tetraethyl ammonium hydroxide(TEAH), tetraethyl ammonium fluoride(TEAF), tetraethyl ammonium chloride (TEA-Cl), dimethyl diethyl ammonium hydroxide, dimethyl diethyl ammonium fluoride, dimethyl diethyl ammonium chloride, alkylbenzyldimethylammonium hydroxide, diethylenetriamine, triethylenetetramine (TETA), tetraethylenepentamine, aminoethylethanolamine (AEEA) and piperazine.

7. The CMP composition according to claim 1, wherein the content of the phosphate anionic additives is 0.01 to 3 wt %.

8. The CMP composition according to claim 1, wherein the phosphate anionic additives are phosphate esters or polyphosphate esters.

9. The CMP composition according to claim 1, wherein the phosphate anionic additives contain a fluorocarbon group.

10. The CMP composition according to claim 1, wherein the content of the fluorine compounds is 0.01 to 1 wt %.

11. The CMP composition according to claim 1, wherein the fluorine compound is TMAF or TMAF salt.

12. The CMP composition according to claim 1, further comprising one or more kinds of materials selected from the group consisting of a dispersant, buffer solution and salts.

13. The CMP composition according to claim 1, wherein the CMP composition is prepared by adding TMAH to deionized water, gradually introducing fumed silica to disperse it, adding phosphate anionic additives and fluorine compounds to prepare a dispersion comprising fumed silica with secondary particles, and milling the dispersion comprising fumed silica with secondary particles in an opposite collision manner.

14. The CMP composition according to claim 13, wherein the secondary particles have average diameters of 220 to 290 nm.

15. The CMP composition according to claim 13, wherein the composition, in dispersed form, has a poly dispersity of 0.25 or less.

16. The CMP composition according to claim 13, wherein the milling process is jet milling.

17. The CMP composition according to claim 13, wherein the collision of the dispersion is conducted at a pressure of 500 to 3000 kgf/cm$^2$.

18. The CMP composition according to claim 13, wherein the secondary particle of the fumed silica in the dispersion after milling has an average diameter of 150 to 220 nm, and the CMP composition has a poly dispersity of 0.20 or less.

19. A method for planarizing a semiconductor device, comprising etching an oxide film and a nitride film of the semiconductor device, on which the nitride film and the oxide film are sequentially laminated, to chemically and mechanically polish the oxide film and the nitride film, using a CMP slurry composition comprising fumed silica, TMAH (tetramethyl ammonium hydroxide), phosphate anionic additives, fluorine compounds, and deionized water, wherein the phosphate anionic additives are selected from the group consisting of phosphate esters, polyphosphate esters, and phosphate anionic additives containing a fluorocarbon group.

* * * * *